US006825660B2

(12) United States Patent
Boskamp

(10) Patent No.: US 6,825,660 B2
(45) Date of Patent: Nov. 30, 2004

(54) DEGENERATE BIRDCAGE RESONATOR FOR MAGNETIC RESONANCE IMAGING

(75) Inventor: Eddy Benjamin Boskamp, Menomonee Falls, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/063,473

(22) Filed: Apr. 26, 2002

(65) Prior Publication Data

US 2003/0201775 A1 Oct. 30, 2003

(51) Int. Cl.[7] .................................................. G01V 3/00
(52) U.S. Cl. ....................................................... 324/318
(58) Field of Search ................................. 324/300, 307, 324/309, 318, 322; 600/410, 422; 333/219, 221

(56) References Cited

U.S. PATENT DOCUMENTS

| | | | |
|---|---|---|---|
| 4,692,705 A | 9/1987 | Hayes ......................... 324/318 |
| 4,943,775 A | 7/1990 | Boskamp et al. ............ 324/322 |
| 4,973,907 A | 11/1990 | Bergman et al. ............. 324/318 |
| 5,006,803 A | 4/1991 | Boskamp et al. ............ 324/311 |
| 5,030,915 A | 7/1991 | Boskamp et al. ............ 324/318 |
| 5,144,240 A | * 9/1992 | Mehdizadeh et al. ........ 324/318 |
| 5,256,971 A | 10/1993 | Boskamp ..................... 324/318 |
| 5,347,220 A | * 9/1994 | Van Heelsbergen .......... 324/318 |
| 5,387,867 A | * 2/1995 | Bourg et al. ................. 324/316 |
| 5,399,970 A | 3/1995 | Pelc et al. .................... 324/309 |
| 5,510,714 A | * 4/1996 | Takahashi et al. ........... 324/318 |
| 5,557,247 A | 9/1996 | Vaughn, Jr. ................... 333/219 |
| 5,559,434 A | * 9/1996 | Takahashi et al. ........... 324/318 |
| 5,682,098 A | 10/1997 | Vij ............................... 324/318 |
| 5,759,152 A | 6/1998 | Felmlee et al. .............. 600/410 |
| 5,898,306 A | * 4/1999 | Liu et al. ..................... 324/322 |
| 5,905,378 A | 5/1999 | Giaquinto et al. ........... 324/318 |
| 5,998,999 A | 12/1999 | Richard et al. .............. 324/318 |
| 6,029,082 A | 2/2000 | Srinivasan et al. .......... 600/422 |
| 6,043,658 A | * 3/2000 | Leussler ....................... 324/318 |
| 6,246,897 B1 | 6/2001 | Foo et al. ..................... 600/413 |
| 6,249,121 B1 | 6/2001 | Boskamp et al. ............ 324/318 |
| 6,255,816 B1 | 7/2001 | Robitaille .................... 324/300 |
| 6,344,745 B1 | 2/2002 | Reisker et al. ............... 324/318 |
| 6,396,273 B2 | * 5/2002 | Misic ........................... 324/318 |
| 6,411,090 B1 | * 6/2002 | Boskamp ..................... 324/318 |
| 6,522,140 B2 | * 2/2003 | Harvey ......................... 324/307 |
| 6,522,143 B1 | * 2/2003 | Fujita et al. ................. 324/318 |
| 2001/0005136 A1 | 6/2001 | Misic ........................... 324/318 |
| 2002/0011843 A1 | 1/2002 | Harvey ......................... 324/307 |

FOREIGN PATENT DOCUMENTS

WO  WO 01/69277 A2  9/2001

OTHER PUBLICATIONS

Cecil E. Hayes, William A. Edelsten, John F. Schenck, Otward M. Mueller, and Mathew Ball, "An Efficient Highly Homogeneous Raiofrequency Coil for Whole–Body NMR Imaging at 1.5T," *Journal of Magnetic Resonance 63*, Dec. 28, 1984; pp. 622–628.

(List continued on next page.)

*Primary Examiner*—Diego Gutierrez
*Assistant Examiner*—Dixomara Vargas
(74) *Attorney, Agent, or Firm*—Cantor Colburn LLP

(57) ABSTRACT

An apparatus for magnetic resonance imaging is disclosed. In an exemplary embodiment, the apparatus includes a degenerate birdcage coil having a pair of opposing rings and a plurality of rungs positioned circumferentially around the pair of rings. Input excitation circuitry is used for applying excitation radio frequency (RF) energy to the degenerate birdcage coil at a first resonance mode of the coil. In addition, output receiving circuitry is used for receiving RF energy emitted by an object positioned within the degenerate birdcage coil. The output receiving circuitry receives the emitted RF energy at a plurality of resonance modes of the degenerate birdcage coil, including said first resonance mode. Thereby, the degenerate birdcage coil may be used as a phased array or for sensitivity encoding.

31 Claims, 14 Drawing Sheets

OTHER PUBLICATIONS

Cecil E. Hayes and Peter B. Roemer, "Noise Correlations in Data Simultaneously Acquired from Multiple Surface Coil Arrays," *Magnetic Resonance In Medicine 16*, Jun. 12, 1989; pp. 181–191.

Ray F. Lee, Charles R. Westgate, Robert G. Weiss, David C. Newman, and Paul Bottomley,"Planar Strip Array (PSA) for MRI," *Magnetic Resonance in Medicine*, (2001), pp. 673–683.

Christopher Leussler, Jaro Stimma and Peter Roschmann, "The Bandpass Birdcage Resonator Modified as a Coil Array for Simultaneous MR Acquisition," p. 1.

Viz Muller, "90 Power Splitters and Conbiners," *RF Design Guide*, pp. 156–158.

Klaas P. Pruessmann Markus Weiger, Markus B. Scheidegger, and Peter Bosiger, "SENSE: Sensitivity Encoding for Fast MRI," *Magnetic Resonance in Medicine*, (1999), pp. 952–962.

P. B. Roemer, W.A. Edelstein, C.E. Hayes, S.P. Souze an O.M. Mueller, "The NMR Phased Array," Magnetic Resonance In Medicine 16, Oct. 3, 1989, pp. 193–225.

James Tropp, "The Hybrid Bird Cage Resonator," p. 1.

Markus Weiger, Klaas P. Pruessman Christoph Leussler, Peter Roschmann, and Peter Bosiger, "Specific Coil Design for SENSE: A Six–Element Cardiac Array," *Magnetic Resonance in Medicine*, (*2001*), pp. 495–504.

\* cited by examiner

DEGENERATE BIRDCAGE RESONATOR FOR MAGNETIC RESONANCE IMAGING

BACKGROUND OF INVENTION

The present disclosure relates generally to magnetic resonance imaging (MRI) and, more particularly, to a degenerate birdcage resonator for MRI.

A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the nuclear magnetic radiation (NMR) signal emitted by a given precessing nucleus depends on the strength of the magnetic field at the nucleus' location. As is well known in the art, it is possible to distinguish radiation originating from different locations within the person's body simply by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the simple application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

MRI has proven to be a valuable clinical diagnostic tool for a wide range of organ systems and pathophysiologic processes. Both anatomic and functional information can be gleaned from the data, and new applications continue to develop as the technology and techniques for filling the k-space matrix improve. As technological advances have improved achievable spatial resolution, for example, increasingly finer anatomic details have been able to be imaged and evaluated using MRI. Often, however, there is a tradeoff between spatial resolution and imaging time, since higher resolution images require a longer acquisition time. This balance between spatial and temporal resolution is particularly important in cardiac MRI, for example, where fine details of coronary artery anatomy must be discerned on the surface of a rapidly beating heart.

Imaging time is largely a factor of the speed with which the MRI device can fill the k-space matrix. In conventional MRI, the k-space matrix is filled one line at a time. Although many improvements have been made in this general area, the speed with which the k-space matrix may be filled is limited.

To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

One such parallel imaging technique that has recently been developed and applied to in vivo imaging is referred to as SENSE (SENSitivity Encoding). The SENSE technique is based on the recognition of the fact that the spatial sensitivity profile of the receiving elements (e.g., resonators, coils, antennae) impresses on the spin resonance signal position information that can be used for the image reconstruction. The parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., Magnetic Resonance in Medicine Vol. 42, p.952–962, 1999).

A drawback of the SENSE technique, however, results when the component coil sensitivities are either insufficiently well characterized or insufficiently distinct from one another. These instabilities may manifest as localized artifacts in the reconstructed image, or may result in degraded signal-to-noise ratio (SNR). Accordingly, it is desirable to implement RF coil arrays and/or volume coils in MRI systems that (among other aspects) provide increased SNR with or without the use of parallel imaging techniques such as SENSE.

SUMMARY OF INVENTION

The above discussed and other drawbacks and deficiencies of the prior art are overcome or alleviated by an apparatus for magnetic resonance imaging. In an exemplary embodiment, the apparatus includes a degenerate birdcage coil having a pair of opposing rings and a plurality of rungs positioned circumferentially around the pair of rings. Input excitation circuitry is used for applying excitation radio frequency (RF) energy to the degenerate birdcage coil at a first resonance mode of the coil. In addition, output receiving circuitry is used for receiving RF energy emitted by an object positioned within the degenerate birdcage coil. The output receiving circuitry receives the emitted RF energy at a plurality of resonance modes of the degenerate birdcage coil, including said first resonance mode. Thereby, the degenerate birdcage coil may be used as a phased array or for sensitivity encoding.

In another aspect, a degenerate birdcage resonator for magnetic resonance imaging includes a pair of opposing rings and a plurality of rungs positioned circumferentially around the pair of rings. A means for applying excitation radio frequency (RF) energy to the degenerate birdcage resonator is included such that a homogeneous RF field is established within the degenerate birdcage resonator. Furthermore, a means for independently reading each of a plurality of resonance modes of RF energy received by the degenerate birdcage resonator from an object placed therewithin is also included.

In still another aspect, a magnetic resonance imaging (MRI) system includes a computer, a magnet assembly for generating a polarizing magnetic field, a gradient coil assembly for applying gradient waveforms to the polarizing magnetic field along selected gradient axes, and a radio frequency (RF) transceiver system for applying RF energy to excite nuclear spins of an object to be imaged, and for thereafter detecting signals generated by excited nuclei of said object to be imaged. The RF transceiver system further includes a degenerate birdcage coil having a pair of opposing rings and a plurality of rungs positioned circumferentially around the pair of rings. Input excitation circuitry is used to apply excitation radio frequency (RF) energy to the degenerate birdcage coil at a first resonance mode thereof, while output receiving circuitry is used for receiving RF energy emitted by an object positioned within the degenerate birdcage coil. The output receiving circuitry receives the emitted RF energy at a plurality of resonance modes of the degenerate birdcage coil, including the first resonance mode. The RF energy received by the output receiving circuitry is then processed by the computer to produce MR images of the object to be imaged.

In still another aspect, method for implementing a degenerate birdcage resonator within a magnetic resonance imaging system includes applying excitation radio frequency (RF) energy to the degenerate birdcage resonator such that a homogeneous RF field is established within the degenerate birdcage resonator, and independently reading each of a plurality of resonance modes of RF energy received by the degenerate birdcage resonator from an object placed therewithin.

BRIEF DESCRIPTION OF DRAWINGS

Referring to the exemplary drawings wherein like elements are numbered alike in the several Figures.

DETAILED DESCRIPTION

Figure 1:
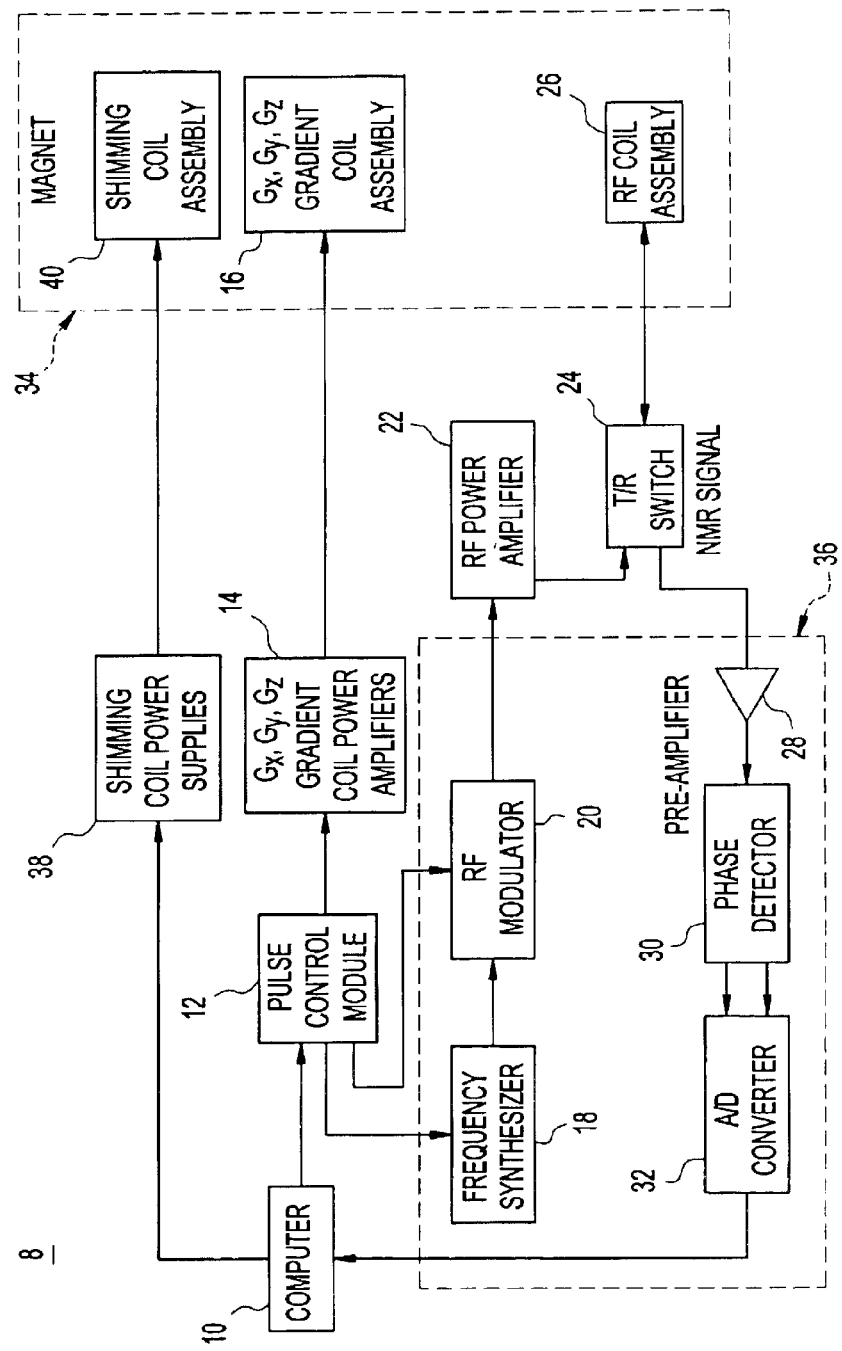
FIG. 1 is a schematic block diagram of an exemplary MR imaging system suitable for use with the present invention embodiments.

Referring initially to FIG. 1, an exemplary magnetic resonance (MR) imaging system 8 includes a computer 10, which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 34 so that gradients Gx, Gy, and Gz are impressed along their respective axes on the polarizing magnetic field B0 from magnet assembly 34.

The pulse control module 12 also controls a radio frequency synthesizer 18 that is part of an RF transceiver system, portions of which are enclosed by dashed line block 36. The pulse control module 12 also controls an RF modulator 20, which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The MR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

Figure 2:
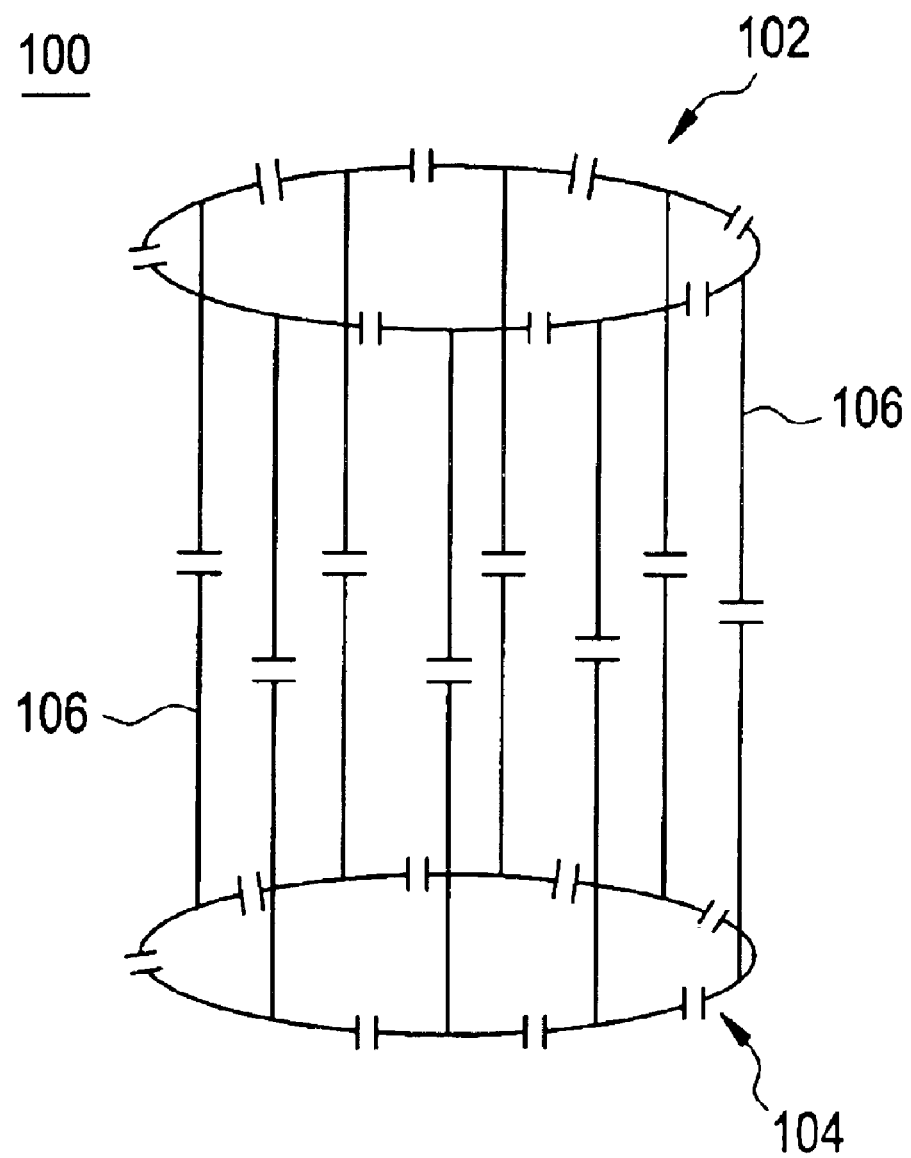
FIG. 2 is a perspective view of a degenerate birdcage resonator that is configured as a phased array or as a SENSE array, in accordance with an embodiment of the invention.

One specific type of RF coil 26 that is employed in MRI is what is known as a birdcage coil, an example of which is shown in FIG. 2. The birdcage coil 100 has a pair of circular end rings 102, 104, which are bridged by a plurality of equally spaced straight segments or rungs 106. In a first or primary mode, currents in the rings 102, 104 and rungs 106 are sinusoidally distributed; that is, the current density distribution therein varies as the cosine of the azimuthal angle. Going around the circumference of the birdcage, the current phase changes by a full 360 degrees. In the example shown, the birdcage coil includes 8 rungs. Thus, the current in one rung is shifted from the current in an adjacent rung by 45° or $\pi/4$.

In traditional MR imaging, the mode of interest has been the mode that provides RF field homogeneity throughout the volume of the coil. This homogeneous mode is characterized by a current distribution in the rungs in accordance with the equation:

$$J_N = J_O \cos(\omega t + N \cdot \Delta\phi)$$

where $J_N$ is the current amplitude of the $N^{th}$ rung, $J_O$ is the maximum rung current in the coil at the homogeneous mode, $\omega$ is the resonance frequency of the coil at the homogeneous mode, N is the rung number and $\Delta\phi$ is the azimuthal angle difference between two adjacent rungs (45° in a 8-rung birdcage). This homogeneous mode will also be referred to as the "first" mode of the coil. In addition, higher modes also exist that are inhomogeneous. More specifically, there are a total of N/2 modes. The rung current distribution in these higher modes is characterized by a faster phase rotation around the coil. For example, the second mode is characterized by a current distribution of $J_N = J_O \cos(\omega t + 2N \cdot \Delta\phi)$. If the birdcage is "degenerate", the resonant frequency, $\omega$, is the same for each mode. Since the higher order modes set up inhomogeneous field distributions, they are unsuitable for excitation purposes. On the other hand, the higher modes may be used for MR signal detection, since they all occur at the same frequency in a degenerate birdcage.

Additional details regarding degenerate birdcage resonators are discussed in an article by James Tropp, entitled "The Hybrid Bird Cage Resonator", ISMRM Book of Abstracts, p.4009 (1992), and also by Christoph Leussler, et al., in an article entitled "The Bandpass Birdcage Resonator Modified as a Coil Array for Simultaneous MR Acquisition", ISMRM Book of Abstracts, p.176 (1997), both of which are incorporated herein by reference. Assuming that the birdcage coil 100 could be excited with the homogenous first mode, while also being able to read out the RF signal independently with each mode operating at the same frequency, then the output signals could further be combined as in a phased array coil to provide improved SNR in areas away from the center of the coil. And, as such, the improved SNR would in turn allow for the use of the SENSE imaging technique as described above. However, in order to implement the SENSE technique in this manner, the geometry factor of the birdcage should be optimized to the extent possible. As will be appreciated, the geometry factor plays a significant role in designing SENSE arrays. The geometry factor is a mathematical function of the coil sensitivities, noise correlation, and the reduction factor R, wherein R denotes the factor by which the number of samples is reduced with respect to conventional, full Fourier encoding. In practice, the coil structure generally does not permit straightforward analytical coil optimization. Thus, simulations have proven to be a valuable tool in seeking optimized coil arrangements for sensitivity encoding, involving the determination of geometry maps and base SNR.

Therefore, in accordance with an embodiment of the invention, there is disclosed a degenerate birdcage resonator with associated readout circuitry, configured such that the birdcage is used as an RF transmit coil in the first homogeneous mode. As a receiver, however, the birdcage further uses both the homogeneous and the inhomogeneous modes, all of which are detected at the same frequency. Thereby, the birdcage coil may be used as a phased array or as a SENSE array. In the exemplary embodiments discussed hereinafter, the birdcage resonator 100 is an 8-rung device. However, it will be appreciated that the principles of the present invention embodiments are also applicable to birdcage resonators having a different number of rungs.

Figure 3:
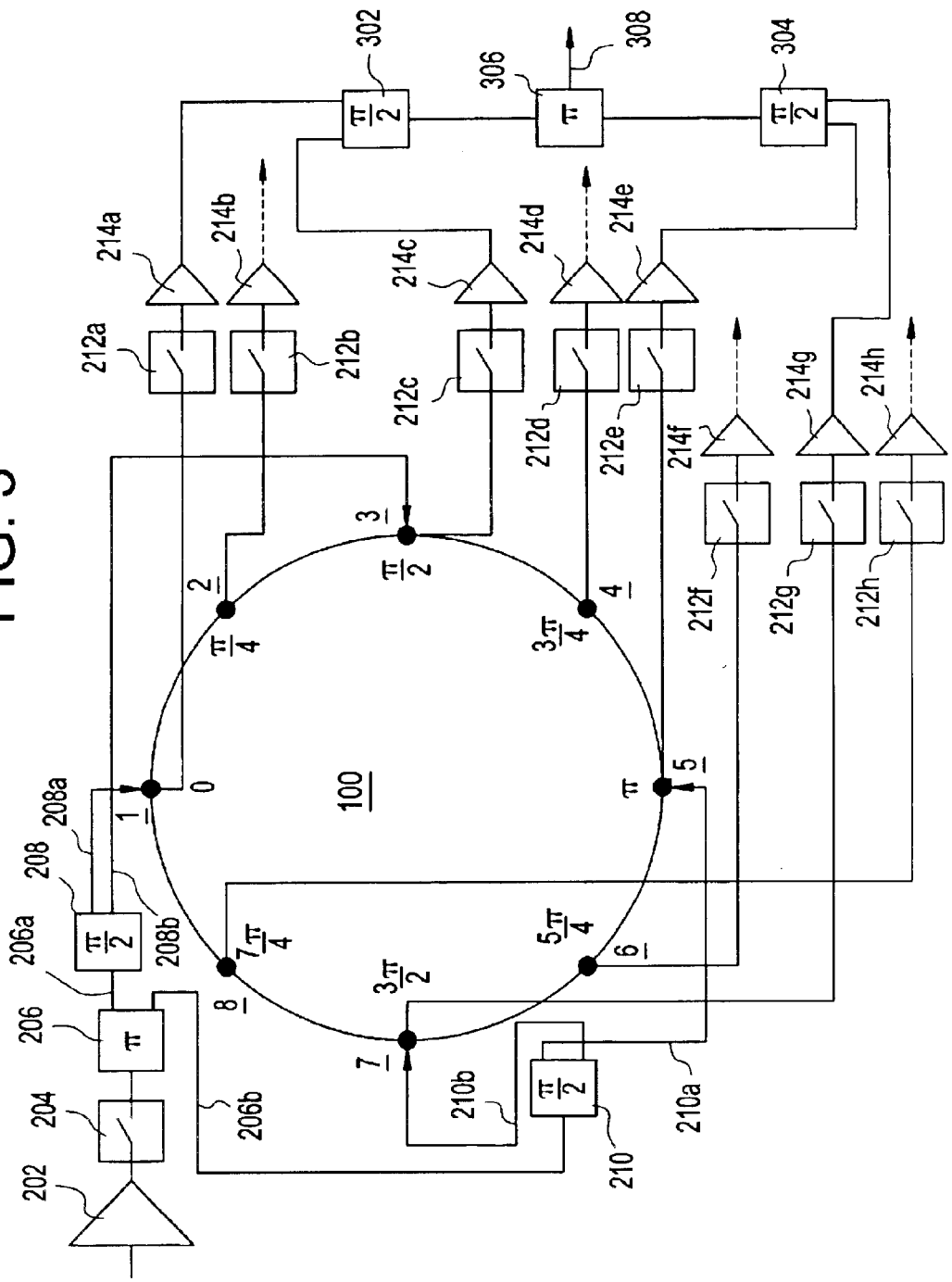
FIG. 3 is a schematic diagram of the excitation and readout circuitry used for the degenerate birdcage resonator of FIG. 2, in the first resonance mode.

Referring now to FIG. 3, there is shown a schematic diagram of the 8-rung birdcage 100, along with excitation and receive circuitry used for the homogeneous first mode. For illustration purposes, the individual rungs of the birdcage 100 are numbered 1 through 8 in the figure, beginning with the rung at the "12 o'clock" position and proceeding clockwise. Because the excitation for the birdcage 100 only employs the first homogeneous mode, the same circuitry will also be shown in subsequent Figures for the other inhomogeneous modes. However, for simplicity of description, the excitation circuitry will only be described in detail once.

As shown in FIG. 3, a power amplifier 202 amplifies an input excitation signal that is selectively coupled by a transmit/receive (TR) switch 204 to a power splitter 206. The two outputs (206a, 206b) of the power splitter 206 have a 180° phase separation with respect to one another, and thus the symbol "$\pi$" is used within the block to indicate that the power splitter 206 is also a 180° phase shifter. The first output 206a of power splitter 206 is coupled to the input of power splitter 208, while the second output 206b of power splitter 206 is coupled to the input power splitter 210. Because splitters 208 and 210 are 90° phase shifters, the symbol "$\pi/2$" is used to denote those blocks. Accordingly, outputs 208a and 208b from splitter 208 are separated 90° in phase from one another, as are the outputs 210a and 210b from splitter 210.

By using a 180° phase shifter in combination with two 90° phase shifters, the four ports of the 8-rung birdcage 100 may be excited sinusoidally in the homogeneous mode. The resulting four input signals to the birdcage (208a, 208b, 210a, 210b) are thus applied to rungs 1, 3, 5 and 7, respectively. However, it will be understood that those RF input signals could alternatively be applied to rungs 2, 4, 6 and 8. Both the 180° and the 90° degree phase shifters are known to those skilled in the art, and are described in more detail in, for example Vizmuller, RF Design Guide, Artech House, pp. 156–158 (1995), the contents of which are incorporated herein by reference. The phase shifting networks may be built as a series of transmission lines or, in a preferred embodiment, by their lumped element equivalent.

Turning now to the receive circuitry, FIG. 3 further illustrates a set of eight TR switches 212a–212h, and associated high input impedance amplifiers 214a–214h, that are respectively coupled to birdcage rungs 1 through 8. The eight TR switches 212a–212h are well known to those skilled in the art, and provide preamp protection from the RF excitation pulse. The high-impedance preamplifiers 214a–214h on the rungs provide further isolation between individual elements within the readout circuitry (and also between the readout circuitry and the birdcage), as well as set the noise figure for the receive chain. Baluns (not shown) are also known to those skilled in the art and are preferably used to kill common cable modes that interfere with the MR signal. As is the case with the amplifier 202, the TR switch 204 and phase shifting power splitters 206, 208 and 210 on the transmit side, TR switches 212a–212h and amplifiers 214a–214h are also shown in subsequent Figures that discuss the inhomogeneous modes, but are only described in detail once.

Although each of the eight rungs of birdcage 100 has output circuitry associated therewith, only four are used in the readout of any given mode. Again, FIG. 3 illustrates the both the RF input and output of the homogeneous mode. Therefore, the relative phases of the output signals on the rungs 1 through 8 are separated by same amount as the physical angle therebetween (i.e., 45° or $\pi/4$). For ease of illustration, the relative phases of the output signals for each rung are shown in FIG. 3, beginning with 0 at rung 1, and proceeding in increments of $\pi/4$ to $7\pi/4$ at rung 8.

In receiving the homogeneous first mode signal, the individual signals from the rungs are recombined into a common phase, single output. This is implemented by first combining output signals from rungs 1 and 3 with 90° combiner 302. As is known in the art, a 90° combiner adds two input signals that are initially 90° out of phase with respect to one another into a single, in phase output. In addition, the output signals from 5 and 7 are combined with 90° combiner 304. Then, the outputs from the 90° combiners 302, 304 are then combined by a 180° combiner 306 to result in a single, first mode output signal 308. It will be further noted, that since the outputs of rungs 2, 4, 6 and 8 are not used in the readout of the first mode, the outputs from amplifiers 214b, 214d, 214f and 214h are shown as dashed arrows.

Figure 4:
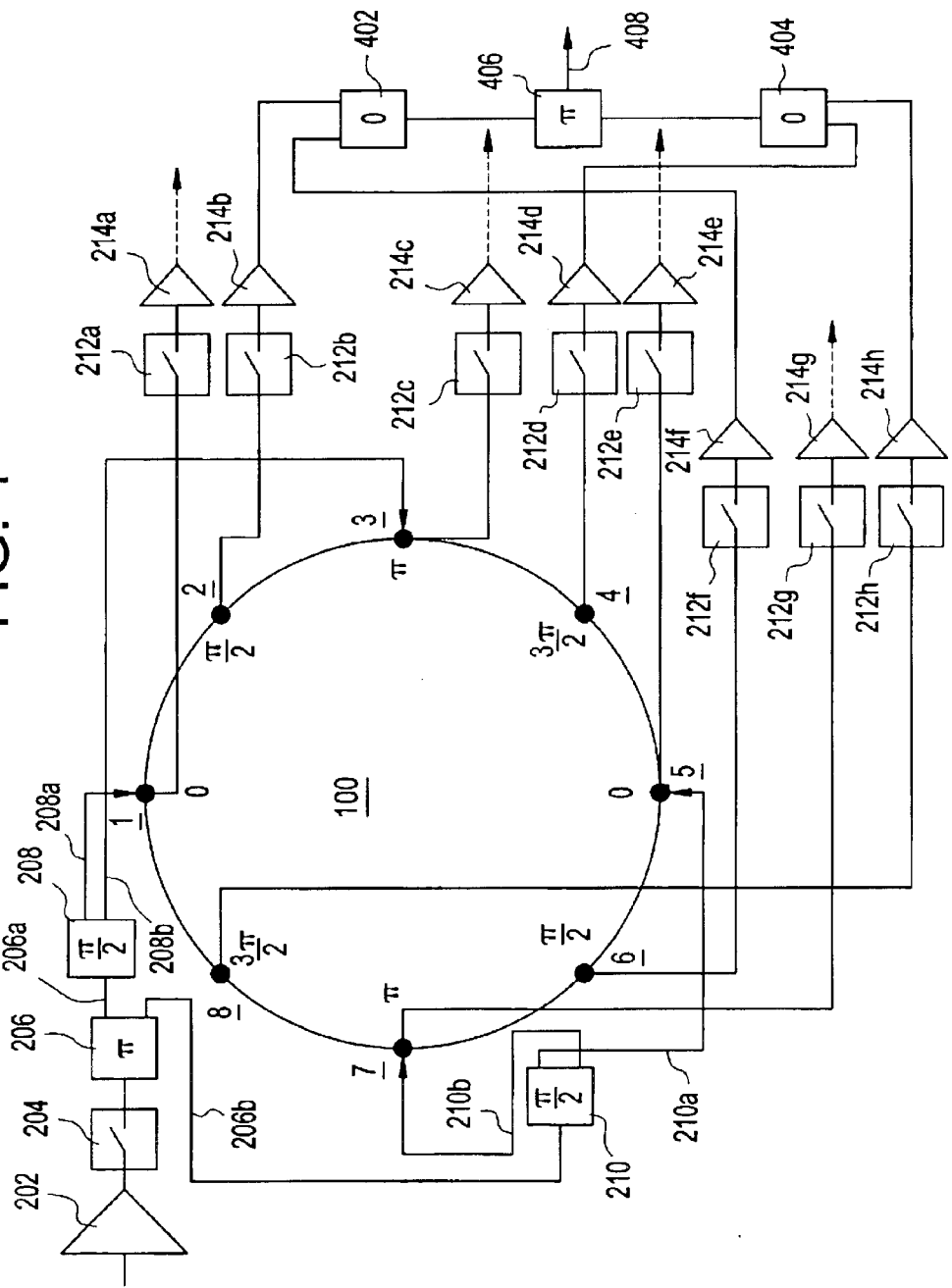
FIG. 4 is a schematic diagram of the excitation and readout circuitry used for the degenerate birdcage resonator of FIG. 2, in the second resonance mode.

Referring now to FIG. 4, there is shown a similar schematic diagram of the birdcage coil input and output circuitry as was shown in FIG. 3, only this time illustrating the readout of the second resonance mode. Since the second mode signals are sinusoidally proportional to twice the azimuthal angle, the relative phase distribution around the rungs progresses in increments of $\pi/2$, as is shown in FIG. 4. It will be noted in the second mode that rungs 1 and 5 are in phase with one another, as are rung pairs 2/6, 3/7 and 4/8. Therefore, in reading out the second mode, the selected rung signals are recombined into a single phase, as was the case for the first mode. In this mode, however, the phase combiners will be different than the ones used in the first mode. (Also, in this mode, the signals are read from rungs 2, 4, 6 and 8, while the signals from rungs 1, 3, 5 and 7 are not used.) Since the signals from rungs 2 and 6 are in phase (at $\pi/2$), they are directly combined by combiner 402, without any phase shifting. Thus, the legend "0" is used in the block designating the combiner 402. Correspondingly, the signals from rungs 4 and 8, being in phase at $3\pi/2$, are directly combined by combiner 404. The outputs from combiners 402 and 404 are then combined by a 180° combiner 406 to result in a single, second mode output signal 408.

Figure 5:
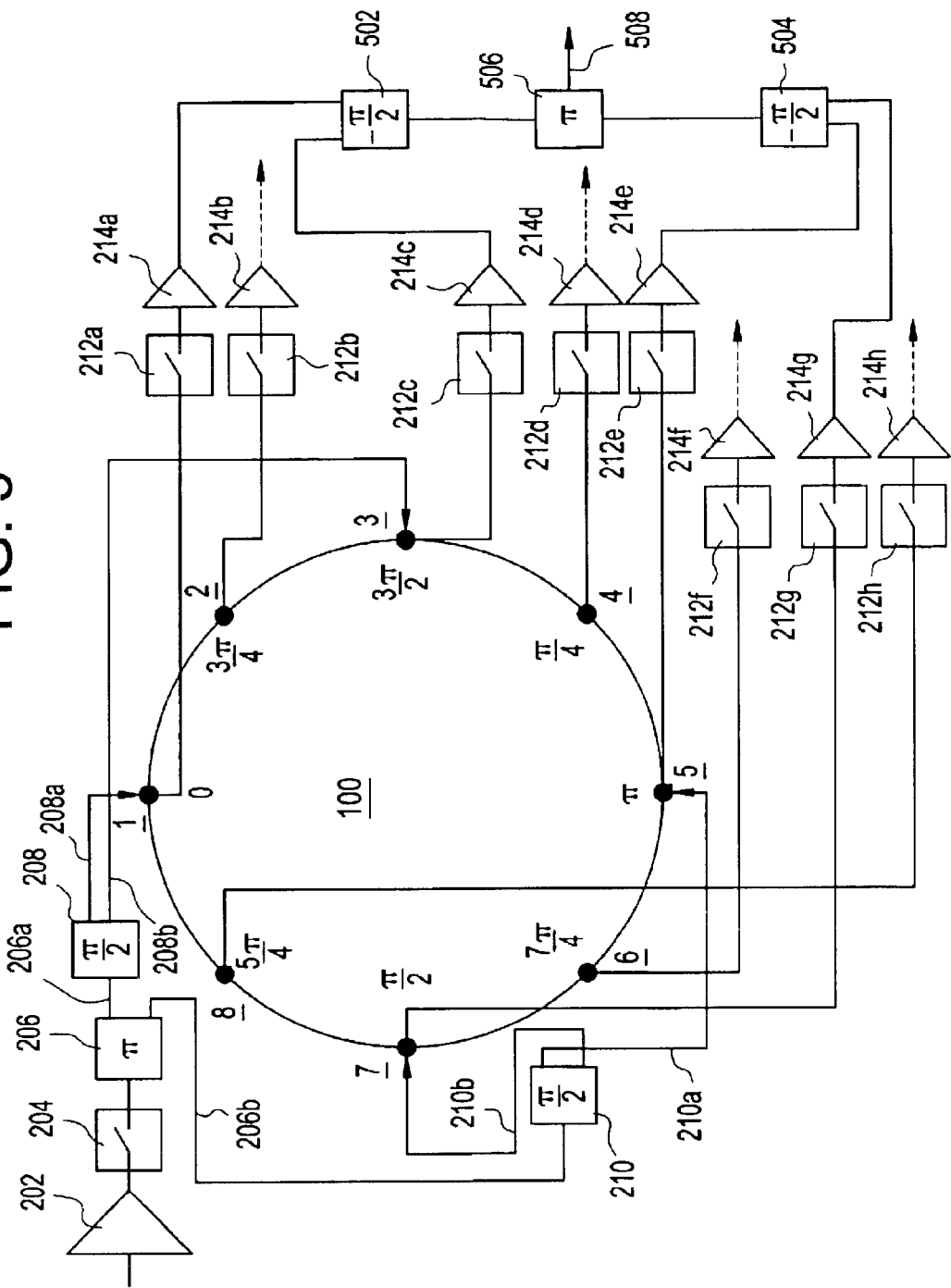
FIG. 5 is a schematic diagram of the excitation and readout circuitry used for the degenerate birdcage resonator of FIG. 2, in the third resonance mode.

It is readily apparent that, depending upon the phase relationships of the rung output signals for a given mode, an appropriate combination of phase shifting combiners (and/or combiners with no phase shifting at all) may be used to produce a single, combined output signal for that mode. Continuing on to FIG. 5, the signal readout for the third resonance mode is illustrated. As is shown, the phase relationship for the rung output signals in this mode is sinusoidally proportional to three times the azimuthal angle. Thus, the phase shift between adjacent rungs progresses in increments of $3\pi/4$. As was the case with the first mode, rungs 1, 3, 5 and 7 are used for the signal readout. Since there is a phase difference of $3\pi/2$ between the signals on rungs 1 and 3, the output signals therefrom are combined by a 270° combiner 502 (denoted by the legend—$\pi/2$). There is also a phase difference of $3\pi/2$ between the signals on rungs 5 and 7, and the output signals therefrom are combined by 270° combiner 504. The outputs from combiners 502 and 504 are then combined by a 180° combiner 506 to result in a single, third mode output signal 508.

Figure 6:
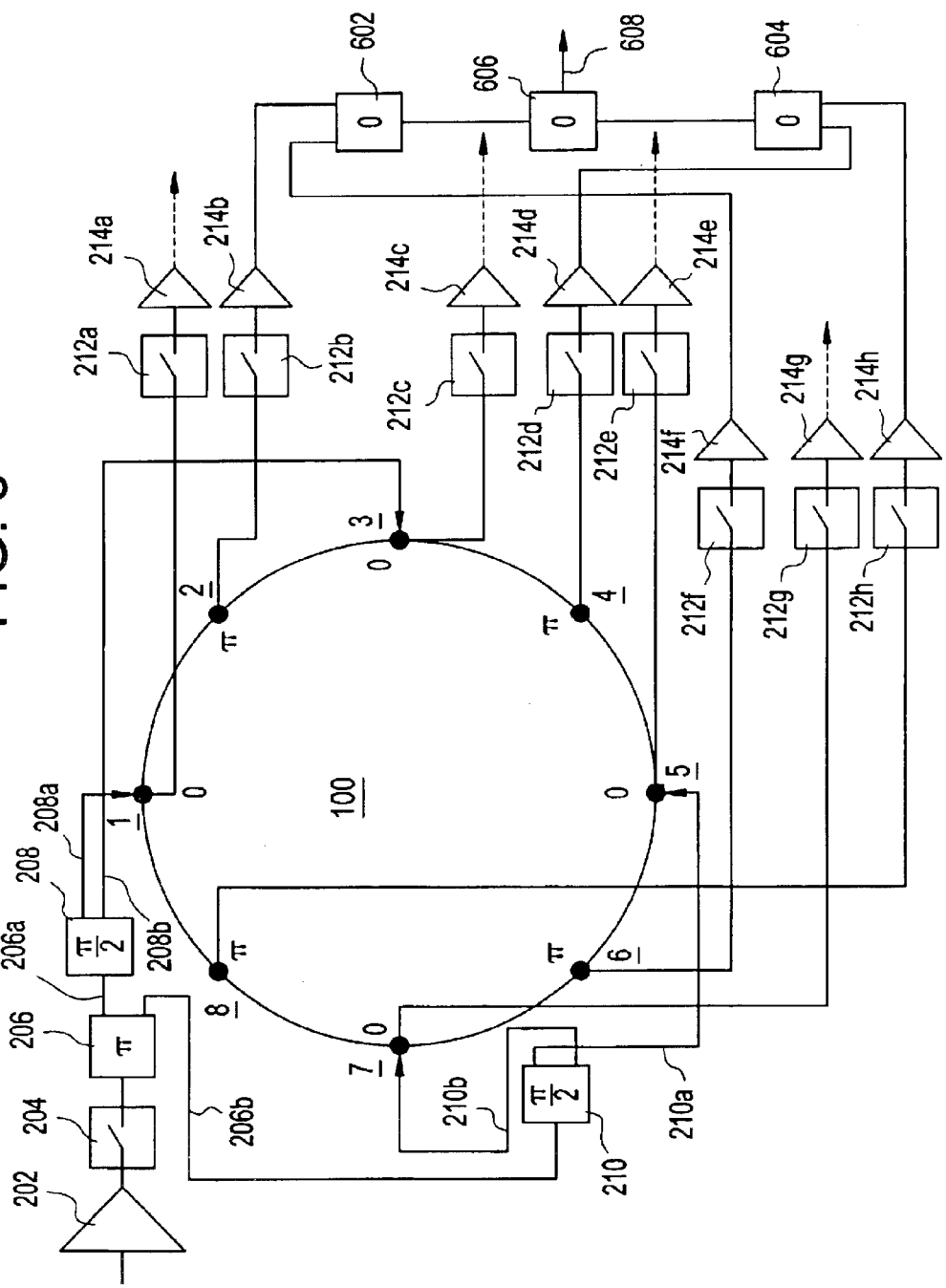
FIG. 6 is a schematic diagram of the excitation and readout circuitry used for the degenerate birdcage resonator of FIG. 2, in the fourth resonance mode.

FIG. 6 illustrates the readout for the fourth mode. Because the phase relationship for the rung output signals in this mode are sinusoidally proportional to four times the azimuthal angle, the output signals on each rung are 180° from an adjacent rung. Accordingly, in reading out the signals on rungs 2, 4, 6 and 8, the signals may be combined without any phase shifting. As shown in FIG. 6, combiner 602 combines the signal from rungs 2 and 6, while combiner 604 combines the signals from rungs 4 and 8. The outputs from combiners 602 and 604 are then combined by a 180° combiner 606 to result in a single, fourth mode output signal 608.

By reading the output signals from each mode in the manner described above, the birdcage coil 100 may be used as a phased array with improved SNR by adding the output signals (308, 408, 508, 608) from each mode by, for example, the sum of squares technique. Alternatively, the four output signals may be used to improve imaging speed in the receive mode by the SENSE technique. In either case, the above described invention embodiments provide isolation between each of the four modes. Again, the first mode, being homogeneous, is used for both excitation and receiving, while the inhomogeneous second, third and fourth modes are used for receiving only.

Figure 7A:
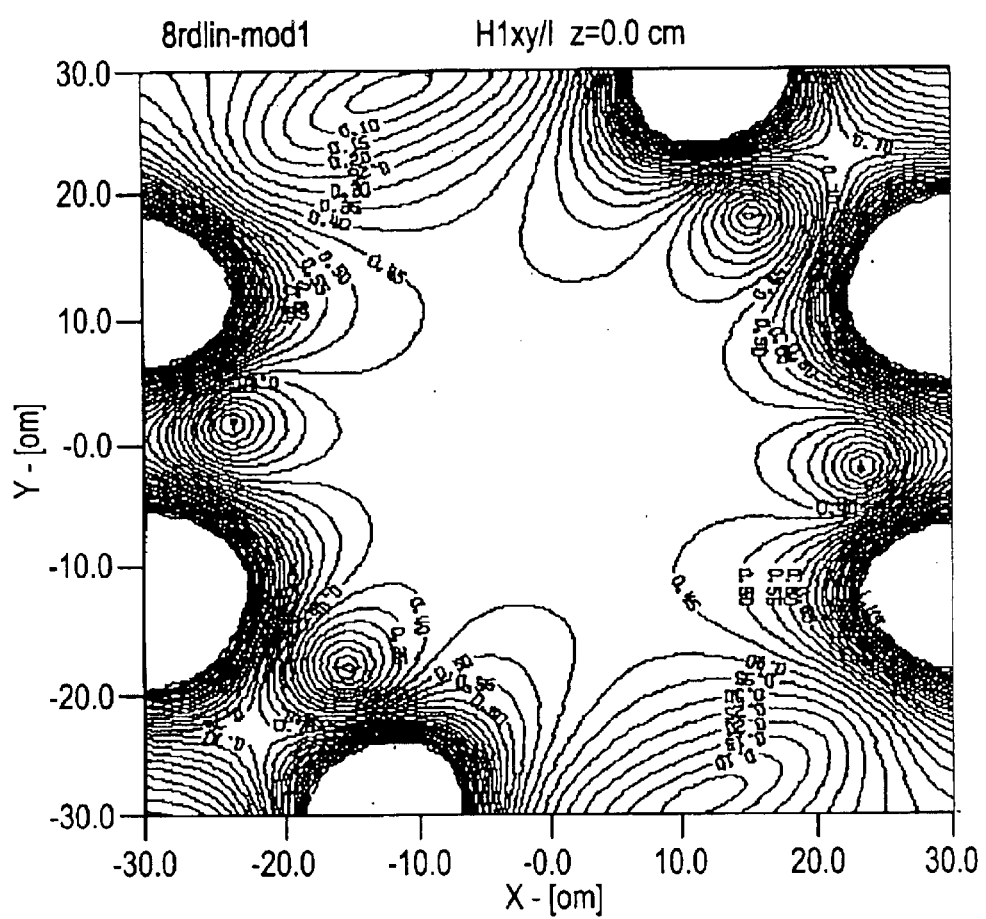
FIGS. 7(a) & (b) through FIGS. 10(a) & (b) illustrate exemplary amplitude and phase isocontour plots for the four resonance modes.
Figure 7B:
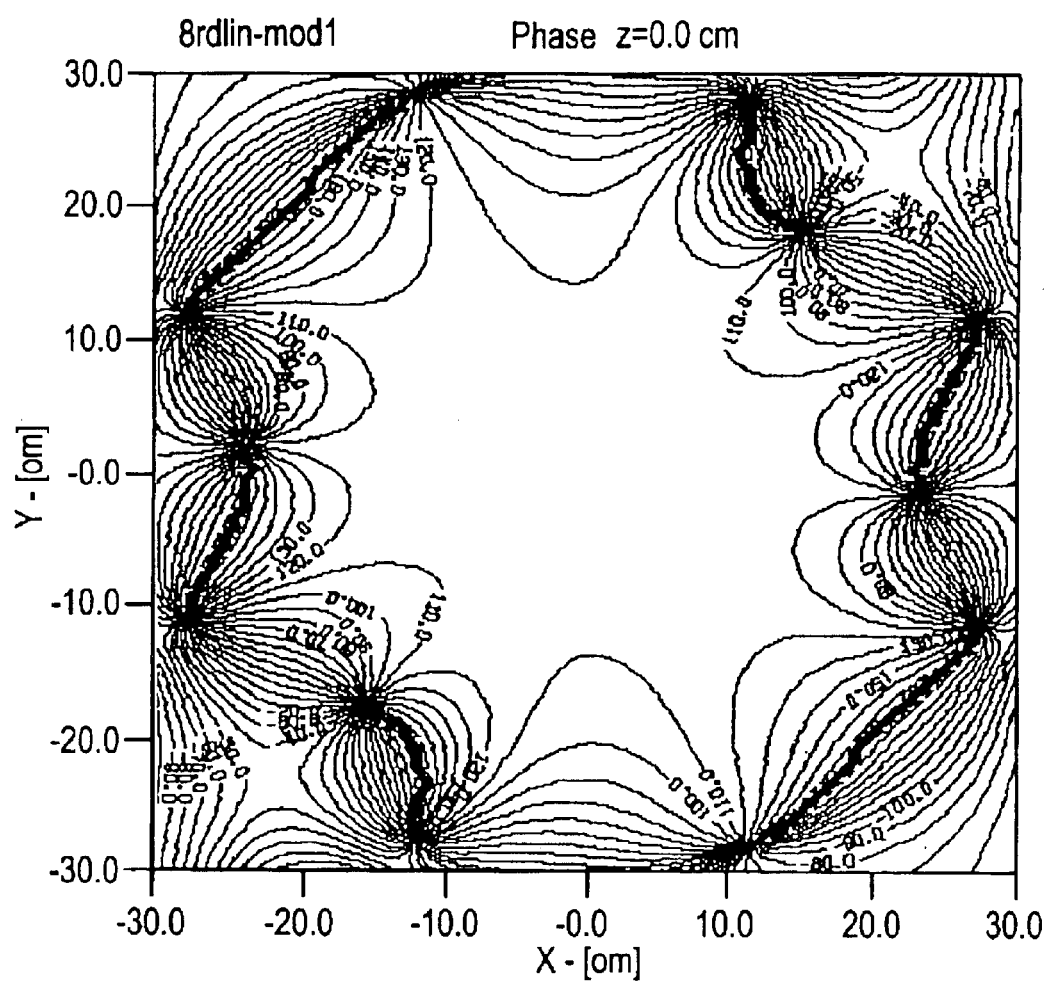
Figure 8A:
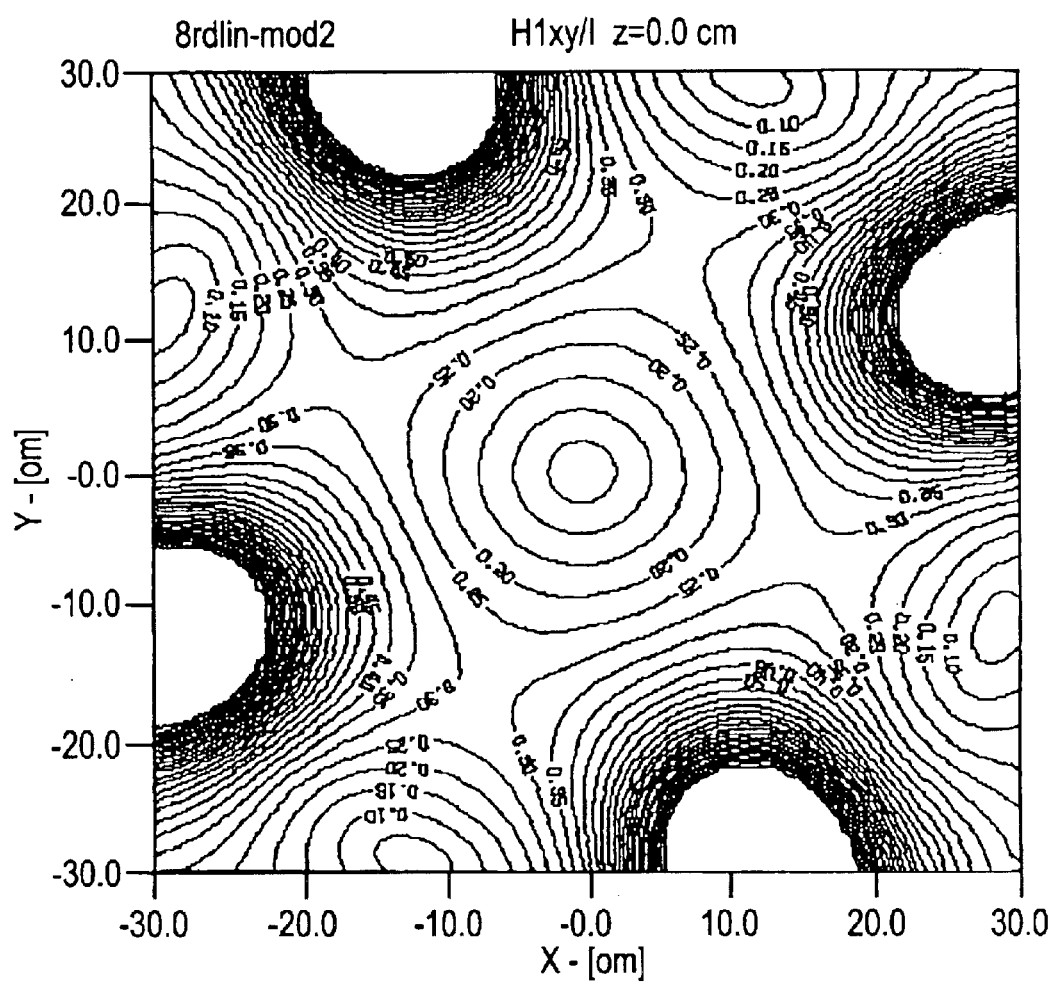
Figure 8B:
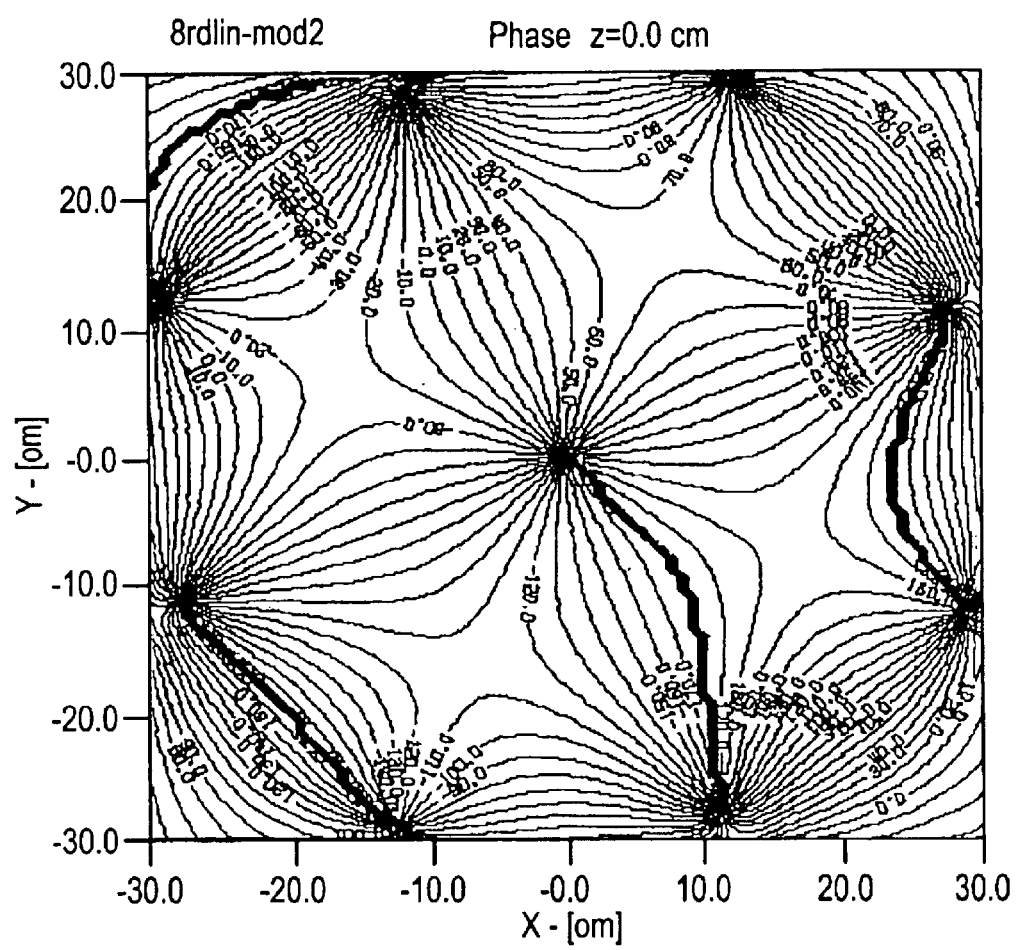
Figure 9A:
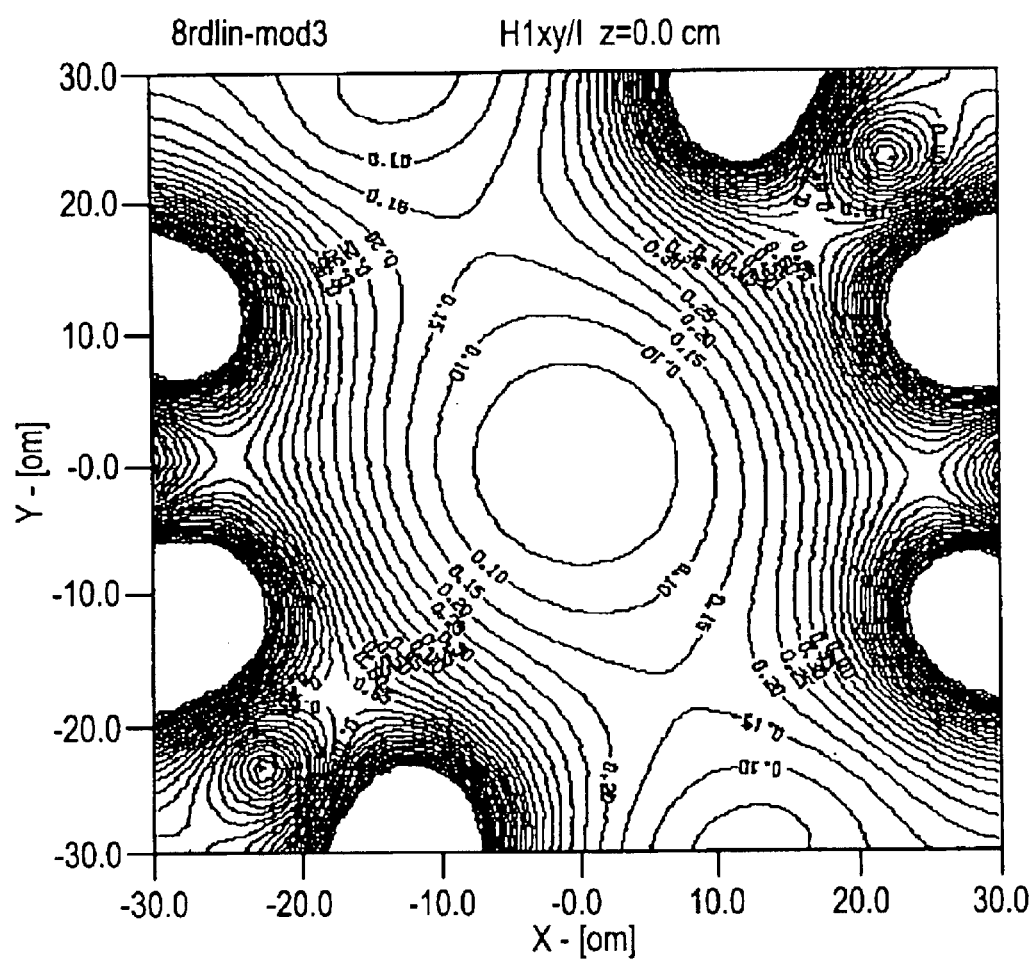
Figure 9B:
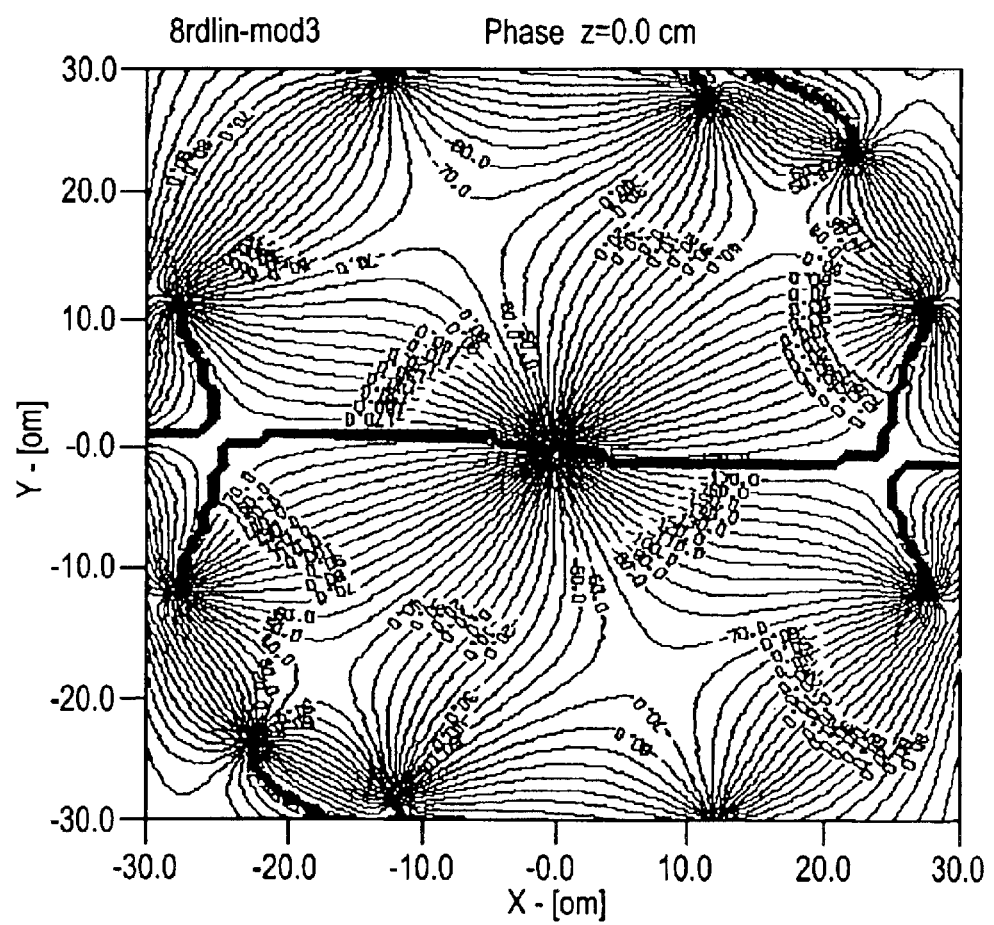
Figure 10A:
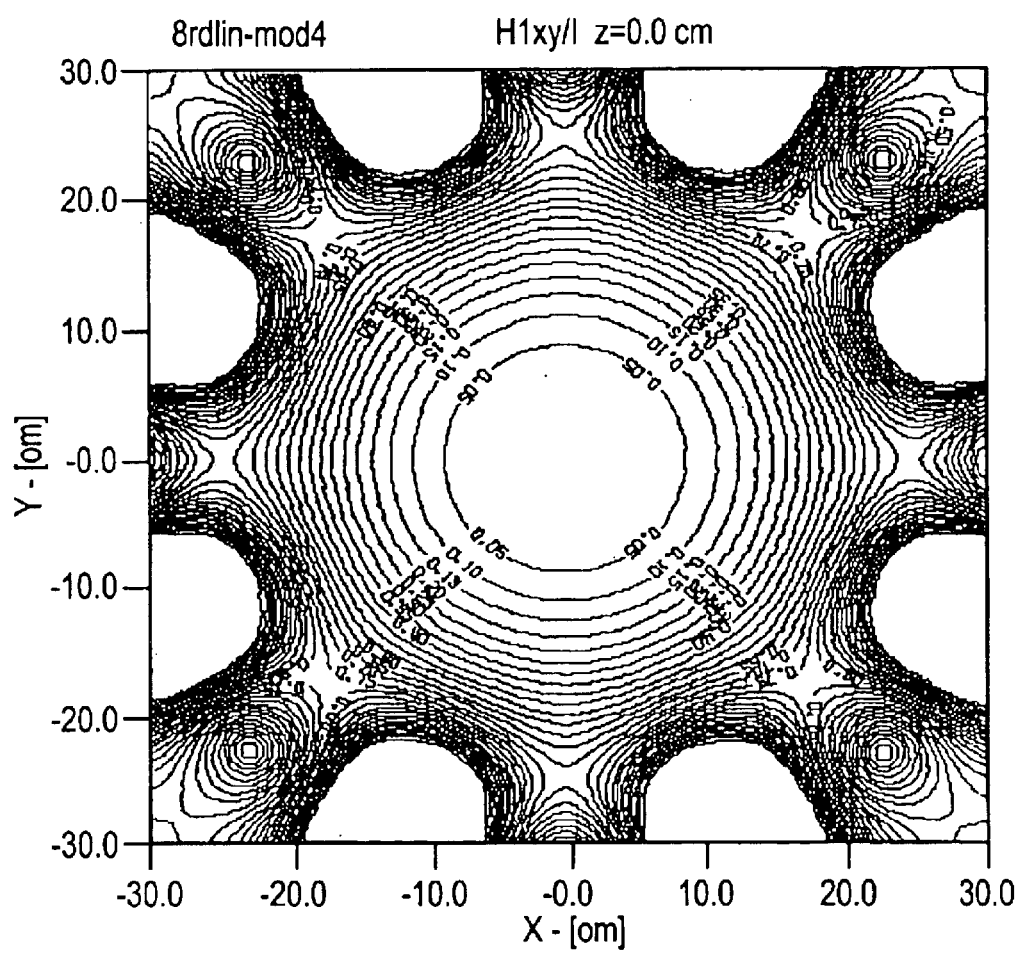
Figure 10B:
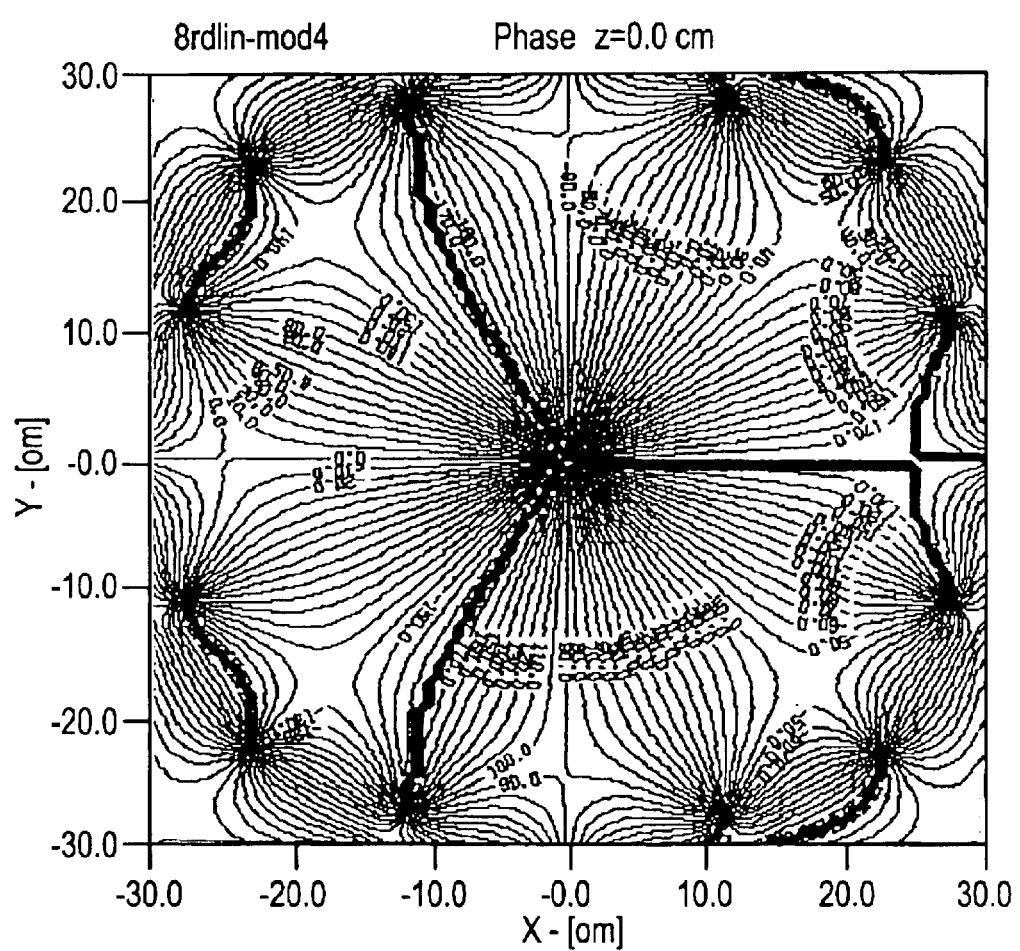

Finally, FIGS. 7(a) & (b) through FIGS. 10(a) & (b) illustrate, by way of example, isocontour plots (lines of equal amplitude or phase at points within the interior of the birdcage coil 100) for the four resonance modes. Of note, FIGS. 7(a) and (b) illustrate the amplitude and phase homogeneity of the first mode in a plane perpendicular to the axis of the coil, near the center of the coil. In contrast, the inhomogeneity of the second, third and fourth resonance modes are also demonstrated in the remaining figures. FIGS. 8(a) and 8(b) are the amplitude and phase isocontour plots, respectively, for the second resonance mode; FIGS. 9(a) and 9(b) are the amplitude and phase isocontour plots, respectively, for the third resonance mode; and FIGS. 10(a) and 10(b) are the amplitude and phase isocontour plots, respectively, for the fourth resonance mode.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for magnetic resonance imaging, comprising: a degenerate birdcage coil configure within a magnetic resonance imaging apparatus having a pair of opposing rings and a plurality of rungs positioned circumferentially around said pair of rings; an input excitation circuitry for applying excitation radio frequency (RF) energy to said degenerate birdcage coil at a first resonance mode thereof; and an output receiving circuitry for receiving RF energy emitted by an object positioned within said degenerate birdcage coil, said output receiving circuitry receiving said emitted RF energy at a plurality of resonance modes at a single frequency of said degenerate birdcage coil, including said first resonance mode; wherein said output receiving circuitry is configured to independently read each of said plurality of resonance modes with respect to one another.

2. The apparatus of claim 1, wherein said input excitation circuitry includes one or more phase shifting splitters for sinusoidally applying said excitation RF energy to one or more of said plurality of rungs.

3. The apparatus of claim 2, wherein said output receiving circuitry include one or more combiners for combining said emitted RF energy from one or more of said plurality of rungs.

4. The apparatus of claim 3, wherein said one or more combiners include phase shifting combiners.

5. The apparatus of claim 4, wherein said degenerate birdcage coil is configured as a phased array by combining said emitted RF energy at each of said plurality of resonance modes.

6. The apparatus of claim 4, wherein each of said plurality of resonance modes is used for sensitivity encoding (SENSE).

7. A degenerated birdcage resonator for magnetic resonance imaging, comprising: a pair of opposing rings and a plurality of rungs positioned circumferentially around said pair of rings; means for applying excitation radio frequency (RF) energy to the degenerate birdcage resonator configured within a magnetic resonance imaging apparatus such that a homogeneous RF field is establish within the degenerate birdcage resonator; and means for independently reading each of a plurality of resonance modes of RF energy at a single frequency received by the degenerate birdcage resonator from an object placed therewithin.

8. The degenerate birdcage resonator of claim 7, wherein said means for applying excitation radio frequency (RF) energy to the degenerate birdcage resonator further comprises one or more phase shifting splitters for sinusoidally applying said excitation RF energy to one or more of said plurality of rungs.

9. The degenerate birdcage resonator of claim 8, wherein said means for independently reading each of a plurality of resonance modes of RF energy received by the degenerate birdcage resonator further comprises one or more combiners for combining said emitted RF energy from one or more of said plurality of rungs.

10. The degenerate birdcage resonator of claim 9, wherein said one or more combiners include phase shifting combiners.

11. The degenerate birdcage resonator of claim 10, wherein the degenerate birdcage resonator is configured as a phased array by combining said emitted RF energy at each of said plurality of resonance modes.

12. The degenerate birdcage resonator of claim 10, wherein each of said plurality of resonance modes is used for sensitivity encoding (SENSE).

13. A magnetic resonance imaging (MRI) system, comprising:
   a computer;
   a magnet assembly for generating a polarizing magnetic field;
   a gradient coil assembly for applying gradient waveforms to said polarizing magnetic field along selected gradient axes; and
   a radio frequency (RF) transceiver system for applying RF energy to excite nuclear spins of an object to be imaged, and for thereafter detecting signals generated by excited nuclei of said object to be imaged, said RF transceiver system further comprising:
      a degenerate birdcage coil having a pair of opposing rings and a plurality of rungs positioned circumferentially around said pair of rings;
      input excitation circuitry for applying excitation radio frequency (RF) energy to said degenerate birdcage coil at a first resonance mode thereof; and
      output receiving circuitry for receiving RF energy emitted by said object to be imaged, positioned within said degenerate birdcage coil, said output receiving circuitry receiving said emitted RF energy at a plurality of resonance modes at a single frequency of said degenerate birdcage coil, including said first resonance mode, said output receiving circuitry further configured to independently read each of said plurality of resonance modes with respect to one another;
   wherein said RF energy received by said output receiving circuitry is processed by said computer to produce MR images of said object to be imaged.

14. The MRI system of claim 13, wherein said input excitation circuitry includes one or more phase shifting splitters for sinusoidally applying said excitation RF energy to one or more of said plurality of rungs.

15. The MRI system of claim 14, wherein said output receiving circuitry includes one or more combiners for combining said emitted RF energy from one or more of said plurality of rungs.

16. The MRI system of claim 15, wherein said one or more combiners include phase shifting combiners.

17. Th MRI system of claim 16, wherein said degenerate birdcage coil is configured as a phased array by combining said emitted RF energy at each of said plurality of resonance modes.

18. The MRI system of claim 16, wherein each of said plurality of resonance modes is used for sensitivity encoding (SENSE).

19. A method for implementing a degenerate birdcage resonator within a magnetic resonance system, the method comprising: applying excitation radio frequency (RF) energy to the degenerate birdcage resonator within the magnetic resonance imaging system such that a homogeneous RF field is established within the degenerate birdcage resonator; and independently reading each of a plurality of resonance modes of RF energy at a single frequency received by the degenerated birdcage resonator from an object placed therewithin.

20. The method of claim 19, wherein said applying excitation radio frequency (RF) energy to the degenerate birdcage resonator further comprises configuring one or more phase shifting for sinusoidally applying said excitation RF energy to one or more of a plurality rungs of the degenerate birdcage resonator.

21. The method of claim 20, wherein said independently reading each of a plurality of resonance modes of RF energy received by the degenerate birdcage resonator further comprises configuring one more combiners for combining said emitted RF energy from one or more of said plurality of rungs.

22. The method of claim 21, wherein said one or more combiners include phase shifting combiners.

23. The method of claim 22, further comprising configuring the degenerate birdcage resonator as a phased array by combining said emitted RF energy at each of said plurality of resonance modes.

24. The method of claim 22, wherein each of said plurality of resonance modes is used for sensitivity encoding (SENSE).

25. A method for implementing a degenerate birdcage resonator within a magnetic resonance system, the method comprising: sinusoidally applying excitation radio frequency (RF) energy to individual rungs of the degenerate birdcage resonator within the magnetic resonance imaging system at a first resonance mode thereof, such that a homogeneous RF field is established therewithin; and independently reading each of a plurality of resonance modes of RF energy at a single frequency, including said first resonance mode, received by the degenerated birdcage resonator from an object placed therewithin.

26. The method of claim 25, wherein said sinusoidally applying excitation radio frequency (RF) energy to the degenerate birdcage resonator further comprise configuring one or more phase shifting splitters for sinusoidally applying said excitation RF energy to one or more of a plurality of rungs of the degenerate birdcage resonator.

27. The method of claim 26, wherein said independently reading each of a plurality of resonance modes of RF energy received by the degenerate birdcage resonator further comprises configuring one or more combiners for combining said emitted RF energy from one or more of said plurality of rungs.

28. The method of claim 27, wherein said one or more combiners include phase shifting combiners.

29. The method of claim 27, wherein said one or more combiners include phase shifting combiners.

30. The method of claim 28, wherein each of said plurality of resonance modes is used for sensitivity encoding (SENSE).

31. The method of claim 25, wherein:
   the degenerate birdcage resonator include eight rungs circumferentially spaced around a pair of opposing rings; and
   said sinusoidally applying excitation radio frequency (RF) energy to the degenerate birdcage resonator further comprises configuring a 180° phase shifting splitter and a pair of 90° phase shifting splitters for sinusoidally applying said excitation RF energy to one or more of said rungs of the degenerate birdcage resonator.

* * * * *

UNITED STATES PATENT AND TRADEMARK OFFICE
CERTIFICATE OF CORRECTION

PATENT NO.       : 6,825,660 B2                                         Page 1 of 1
APPLICATION NO.  : 10/063473
DATED            : November 30, 2004
INVENTOR(S)      : Eddy Benjamin Boskamp It is certified that error appears in the above-identified patent and that said Letters Patent is hereby corrected as shown below:

<u>Column 8,</u>
Line 43, after "circuitry" delete "include" and insert -- includes --.

<u>Column 9,</u>
Line 58, before "MRI" delete "Th" and insert -- The --.

<u>Column 10,</u>
Line 10, after "shifting" insert -- splitters --.
Line 10, after "plurality" insert -- of --.
Line 39, after "further" delete "comprise" and insert -- comprises --.
Line 56, after "resonator" delete "include" and insert -- includes --.

Signed and Sealed this

Twenty-seventh Day of June, 2006

JON W. DUDAS
*Director of the United States Patent and Trademark Office*